United States Patent [19]
Dusablon, Sr. et al.

[11] Patent Number: 5,666,000
[45] Date of Patent: Sep. 9, 1997

[54] MICROCAVITY CAPACITIVE DEVICE

[75] Inventors: Michael Steven Dusablon, Sr., Milton; Eric Jeffrey White, North Ferrisburg, both of Vt.

[73] Assignee: International Business Machines Corporation, Armonk, N.Y.

[21] Appl. No.: 574,596

[22] Filed: Dec. 18, 1995

Related U.S. Application Data

[62] Division of Ser. No. 331,440, Oct. 31, 1994, Pat. No. 5,508,234.

[51] Int. Cl.$^6$ .................................... H01L 29/00
[52] U.S. Cl. ................ 257/532; 257/296; 257/534; 438/396
[58] Field of Search ........................ 257/295, 301, 257/532, 534, 535, 296; 437/919

[56] References Cited

U.S. PATENT DOCUMENTS

| | | | |
|---|---|---|---|
| 3,702,427 | 11/1972 | Learn et al. | 257/767 |
| 4,475,120 | 10/1984 | Binet | 257/534 |
| 5,248,564 | 9/1993 | Ramesh | 257/295 |
| 5,514,564 | 5/1996 | Dusablon, Sr. et al. | 257/531 |

*Primary Examiner*—J. Carroll
*Attorney, Agent, or Firm*—Heslin & Rothenberg, P.C.

[57] ABSTRACT

A method is presented for controlled formation of microcavities for various semiconductor and micro-machine applications. The method involves the steps of defining a void in a support structure, sealing the void with a resilient gas-permeable material such that a chamber is formed, diffusing gas into the chamber through the gas permeable material to create a pressurized chamber, and then allowing expansion of the pressurized chamber within the resilient material, thereby creating an enlarged cavity. The applications set forth include the production of large capacitors, field isolation structures, tubular sensors for chromatography, pressure sensors, and cooling channels for integrated circuits.

5 Claims, 12 Drawing Sheets

MICROCAVITY CAPACITIVE DEVICE

This application is a division of application Ser. No. 08/331,440 filed Oct. 31, 1994 which is now U.S. Pat. No. 5,508,254.

TECHNICAL FIELD

The present invention relates to semiconductor integrated circuit and micro-machine applications, and in particular, the invention relates to a fabrication process for controllably producing cavities in the sub-micron to macroscopic range for, for example, field isolation, heat removal, chromatography, pressure sensing, and electronic component fabrication.

BACKGROUND ART

As integrated circuit dimensions shrink in response to market demands for increased speed and reduced circuit size, spacing between electronic components and conductors becomes ever more critical. Such components and/or conductors are typically separated and isolated by a dielectric material. The best dielectric material is a vacuum, which has a dielectric constant of 1.0. Air is also a very good dielectric, with a constant just slightly higher than that of a vacuum.

Doped glass is commonly used as an integrated circuit dielectric because its melting point can be made significantly lower than that of regular glass or of other dielectric materials. Borophosphosilica glass (BPSG) is one exemplary type of doped glass. After deposition over a pattern of polysilicon conductors, for example, a relatively rough BPSG dielectric layer can be put through a high temperature reflow process, usually at about 900° C., which in effect melts the BPSG and smooths its surface for facilitating subsequent processing steps.

A typical BPSG material, however, has a significantly higher dielectric constant, e.g., about 3.6 to 3.9. One technique which has been used to reduce the dielectric constant of BPSG glass is to allow cavities to form in the material at appropriate locations. The cavities can form during the chemical vapor deposition process in spaces between conductors or between semiconductor mesas. These cavities are essentially air or vacuum filled and therefore constitute a low dielectric constant region between said structures. In this manner, for example, capacitive coupling between adjacent conductors can be reduced, thereby enhancing device signal speed.

Despite speed improvements which voids in BPSG films can provide, their proper size and shape formation is presently difficult to control. For example, voids between adjacent conductors are formed when a BPSG layer is deposited on top of a polysilicon conductive pattern. However, during the fellow process, the voids may disappear if the spaces between polysilicon conductors are large enough or the deposited film is thin enough. The voids formed when a BPSG layer of about 7000 Angstroms is deposited over a circuit topography of conductors separated by about 1.0 micron are typically eliminated during reflow. Unfortunately, it is not possible to forgo the reflow process without also losing the smoothness and related benefits such a structure can provide in subsequent processings.

Thus, as with the above-discussed example, there is a need for an improved method for controllably fabricating cavities for semiconductor and micro-machine applications, such as for pressure sensing, chromatography, fabrication of capacitive components, and selectively isolating components and conductors, etc.

DISCLOSURE OF INVENTION

Briefly summarized, this invention comprises in one aspect a method for forming an enlarged cavity which includes the steps of: defining a void in a support structure; sealing the void with a resilient material such that a chamber is formed; injecting material into the chamber to create a pressurized chamber; and allowing expansion of the pressurized chamber within the resilient material, thereby creating the enlarged cavity. Details of this process are provided herein, along with enhancements thereof. For example, the resilient material can comprise a gas-permeable material so that injecting of material into the chamber can be accomplished by diffusing gas through the resilient gas-permeable material. Further, the method can be employed to simultaneously create a plurality of cavities, each of a desired size and shape, from a sub-micron size to macroscopic size.

Various applications of the above-outlined method are presented. In particular, methods are described for: spacing an overpass conductor from an active device in a semiconductor substrate; producing a pressure sensor above a semiconductor substrate; producing a capacitive device; forming a cooling tube above a support structure proximate to a heat source for facilitating removal of heat generated thereby; and producing an inductor for integrated circuits.

In a further aspect, various semiconductor structures are set forth. Each semiconductor structure has a substrate with a void therein. A dielectric material is disposed above the substrate such that the dielectric material fills the void in the substrate. The dielectric material includes a cavity therein that is disposed above the void and that has a size larger than the size of the void in the substrate. Various configurations of the semiconductor structure are presented, including: a noise spacing structure; a pressure sensor; a capacitive device; an inductor; a chromatography tube; and a cooling channel.

In all aspects, the present invention comprises a novel processing technique, and resultant structure, that includes formation of a pressurized chamber within a resilient material, which is followed by a depressurizing of the surrounding environment to allow the chamber to expand and thereby form an enlarged cavity. The size and shape of the enlarged cavity can be readily tailored. For example, any size in the sub-micron to macroscopic range is possible, as well as various configurations such as spherical, elongated and curved. If desired, multiple cavities can be simultaneously and inexpensively mass produced. The gas filled cavities can be easily integrated into various semiconductor and micro-machine applications for mass production. Applications described herein include production of capacitors, field isolation structures, tubular sensor units (such as micro-chromatography units), pressure sensors, cooling channels and integrated circuit inductors. Those skilled in the art should recognize that a host of other micro-machine and electrical products are possible using the novel cavity structures disclosed herein.

BRIEF DESCRIPTION OF DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Cavity formation in accordance with the present invention is initially described below with reference to FIGS. 1–4. The remaining figures depict various enhanced applications of the basic process disclosed herein. However, those skilled in the art should recognize that the concepts presented are not limited to the particular applications set forth in FIGS. 5a–12f. Rather, the present invention has wide application in many semiconductor or micro-machine devices. The appended claims are intended to encompass all such applications.

Figure 3:
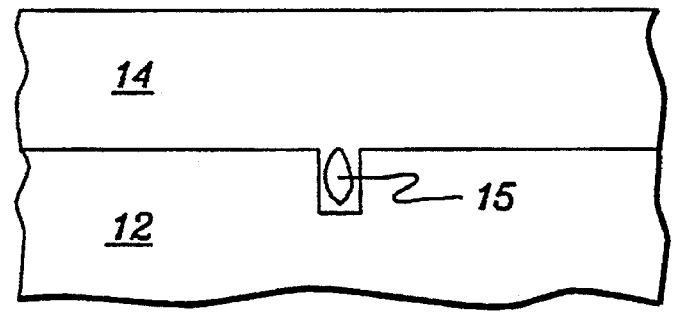
FIG. 3 is a cross-sectional view of the structure of FIG. 2 subsequent to reflowing of the dielectric material and pressurizing of the chamber.
Figure 4:
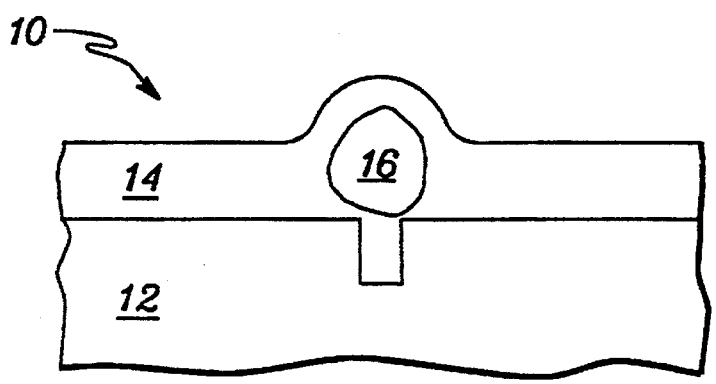
FIG. 4 is a cross-sectional view of the structure of FIG. 3 after formation of an enlarged cavity from the pressurized chamber in accordance with the present invention.

FIG. 4 is a partial cross-sectional view of one embodiment of a structure, generally denoted 10, in accordance with the present invention. Structure 10 includes a supporting substrate 12, such as a semiconductor substrate, above which a cavity 16 has been formed as described herein below. Cavity 16, also referred to herein as an "enlarged cavity," resides within a layer of material 14 disposed above supporting substrate 12. Fabrication processing in accordance with the present invention is first broadly described below with reference to FIGS. 1–4.

Processing begins with formation of a small opening 13 (FIG. 1) in supporting substrate 12. The size and shape of this opening may vary depending upon the particular application and the desired size and shape of the resultant enlarged cavity 16 (FIG. 4). The opening is sized, however, such that material 14 (FIG. 2) will not entirely fill the opening when deposited on the supporting substrate (discussed below). In an alternate embodiment, the opening could be formed in any layer disposed above the supporting substrate. As used herein, the term "void" encompasses such an opening of any desired size and shape formed either within or above supporting substrate 12 (discussed further below).

Figure 1:
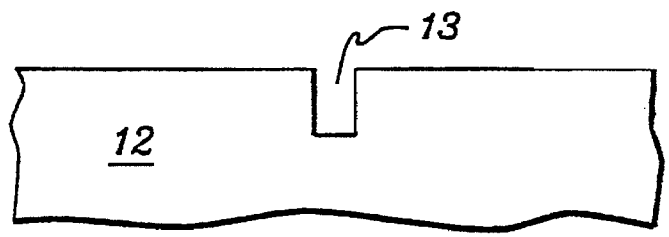
FIG. 1 is a cross-sectional view of a portion of a semiconductor structure having a void therein.
Figure 2:
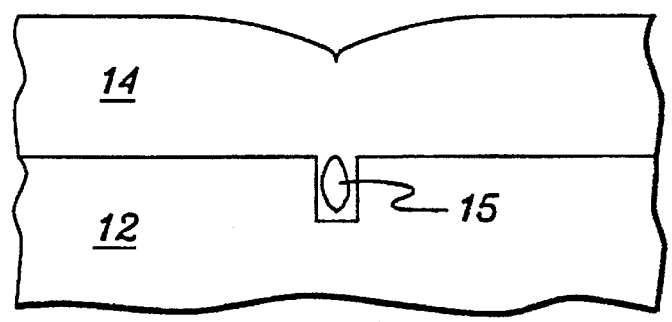
FIG. 2 is a cross-sectional view of the structure of FIG. 1 after formation of a dielectric layer thereon within which a chamber is defined.

Opening 13 is next sealed with a layer of material 14; which may comprise a dielectric material such as glass, or more particularly, a layer of borophosphosilica (BPSG). (Note, however, that material other than dielectric material could be used to form the layer of material 14.) Layer 14 seals opening 13 in supporting substrate 12 such that a chamber 15 is defined. As shown, this chamber 15 initially resides within the walls of the supporting substrate defining opening 13. In one embodiment, layer 14 comprises a gas-permeable material, either initially having resiliency or being transformable into a resilient material upon further processing, such as heat treatment. One presently preferred material for layer 14 is BPSG formed above the supporting substrate by plasma enhanced chemical vapor deposition (PECVD) (FIG. 2). The BPSG is then transformed into a resilient, semi-molten state (FIG. 3) by appropriate heat treatment.

As noted, FIG. 3 depicts an intermediate process structure wherein layer 14 has been partially-melted to improve resiliency. Additionally, a gas such as steam has been injected under pressure into chamber 15 by diffusing the gas through gas-permeable layer 14 such that the chamber has become a pressurized chamber. Then, while layer 14 is in a resilient state, ambient pressure about the composite structure is reduced, allowing the pressurized chamber to expand. Simultaneous with expansion of the chamber, the chamber can migrate from between the walls defining the opening in the supporting substrate to reside entirely within layer 14 above the upper surface of support substrate 12 (FIG. 4). Such migration principally depends upon surface tension of the material used. Further, the size and shape of cavity 16 can be process controlled by, for example, appropriately selecting: the size and shape of opening 13 in supporting substrate 12; the amount of pressurized gas diffused into pressurized chamber 15; the resiliency characteristic of layer 14 within which the resultant cavity 16 resides; as well as the pressures, temperatures and gases employed. If in a semi-molten state, layer 14 is allowed to cool after formation of cavity 16.

Although disclosed above with respect to formation of a single cavity, those skilled in the art will recognize that the process can be readily adapted for simultaneous formation of a plurality of cavities in material 14 above the supporting substrate and further, that the cavities comprising the plurality of cavities may have different sizes and shapes. In this regard, cavity formation in accordance with the present invention can produce a cavity sized anywhere from sub-micron to macroscopic. For many semiconductor and micro-machine industry applications, formation of cavities in the sub-micron to several microns range is presently particularly desirable.

Note again that with processing in accordance with this invention, care should be taken to ensure that chamber 15 does not collapse prior to the expansion step. One technique for ensuring this is to employ BPSG as material 14 and forming the material by PECVD in an under-oxidized regime such that the composition of those portions of the BPSG layer extending horizontally differ from the composition of those portions of the BPSG layer extending vertically. Specifically, $P_2O_3$ can be intentionally deposited on the vertical sidewalls of the opening 13, while $P_2O_5$ can be deposited on the horizontally extending portions of the substrate, i.e., the majority of the phosphorus in the glass. This directional deposition facilitates maintenance of the chamber since the deposited $P_2O_3$ has a significantly higher melting point than the deposited $P_2O_5$. Thus, when layer 14 is raised to a semi-molten state, chamber 15 will remain intact.

As examples of process enhancements/-alternatives, an external opening could be formed directly into chamber 15 to facilitate formation of the pressurized chamber, in which case layer 14 need not be gas-permeable. Further, it is conceivable that liquid or other material could be employed rather than gas to pressurize the chamber. The particular set of materials selected will depend upon desired results and known material characteristics.

Figure 5A:
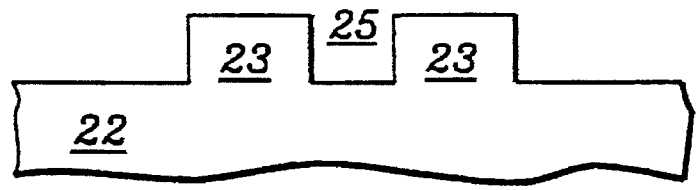
FIGS. 5a–5d successively depict in cross-section an alternate embodiment for forming an enlarged cavity between two mesas in accordance with the present invention.
Figure 5B:
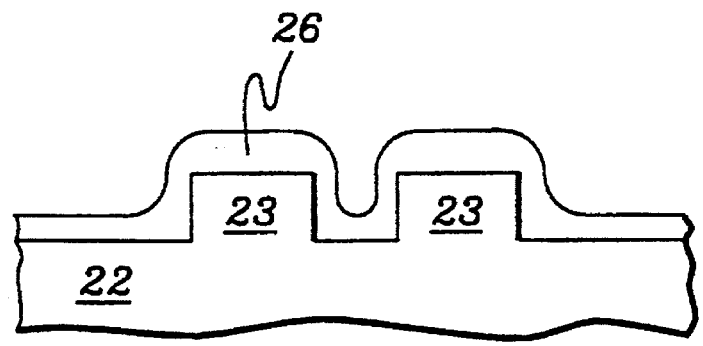

FIGS. 5a–5d depict another variation of the basic process. In this variation, a recess is provided between the vertical sidewalls of adjacent mesas 23 of a supporting structure 22 (FIG. 5a). A layer 26 of glass, e.g., BPSG, is then deposited by chemical vapor deposition over mesas 23 and recess 25 using a deposition method that is directionally preferential such that the composition of portions of the BPSG layer extending horizontally differs from the composition of the portions of the BPSG layer extending vertically (FIG. 5b). In particular, horizontal portions might have a $P_2O_5$ composition, while vertical portions can comprise $P_2O_3$. As noted above, such a compositional difference facilitates maintenance of the chamber prior to formation of the cavity.

Figure 5C:
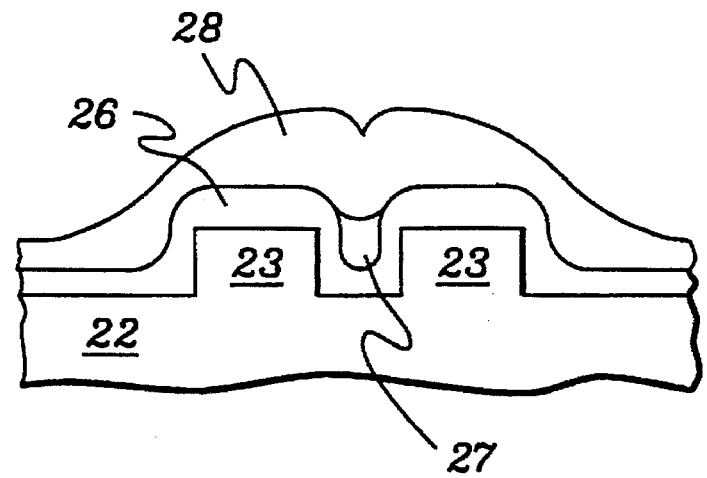
Figure 5D:
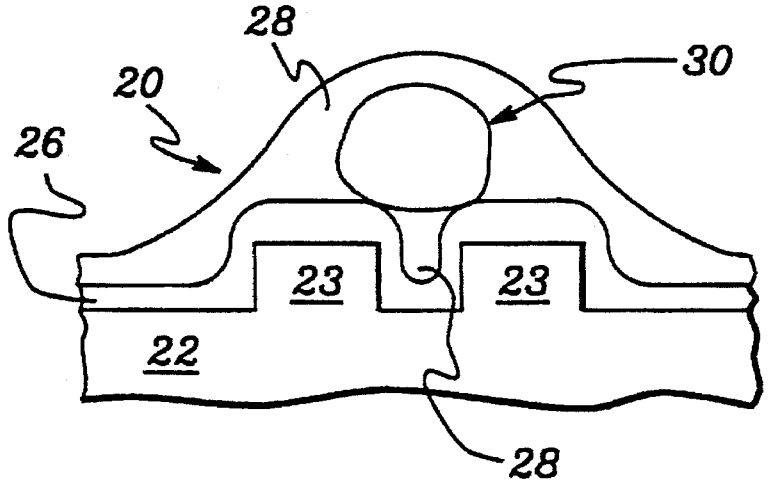

A resilient gas-permeable cap layer 28, e.g., another BPSG layer, is next deposited over glass layer 26 such that a chamber 27 remains between the two glass layers (FIG. 5c). Gas, such as steam at 10 ATM and 750° C., is then injected by diffusion through resilient gas-permeable layer 28. This gas will dissolve in the $P_2O_3$ portions which are not very reflowable, thereby forming the pressurized chamber. The surrounding environment is then depressurized while conditions necessary for gas permeable layer 28 to expand are maintained such that pressurized chamber 27 enlarges to form cavity 30 of the resultant structure (FIG. 5d). As with the embodiment of FIGS. 1–4, the size and shape of cavity 30 can be readily tailored by controlling, e.g., the size and shape of the recess between the mesas, as well as pressures, temperatures and gasses used.

Figure 6A:
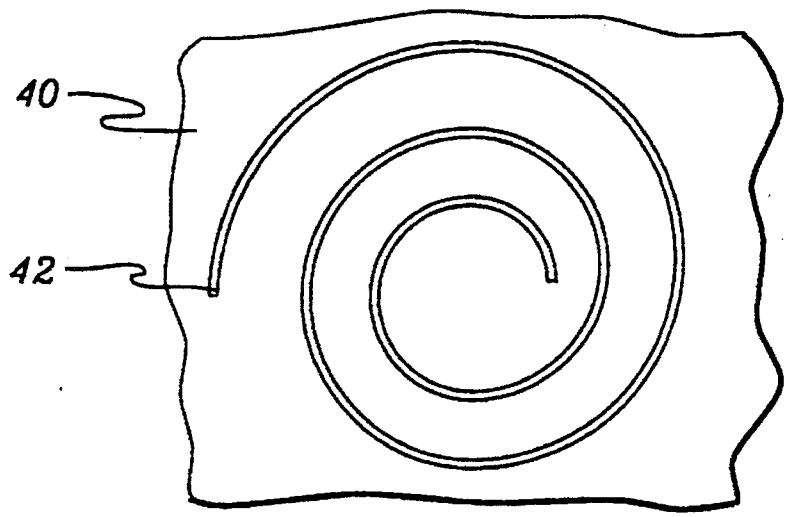
FIG. 6a is a partial plan view of a spiral-shaped trench in a supporting structure pursuant to one application of the present invention.
Figure 6B:
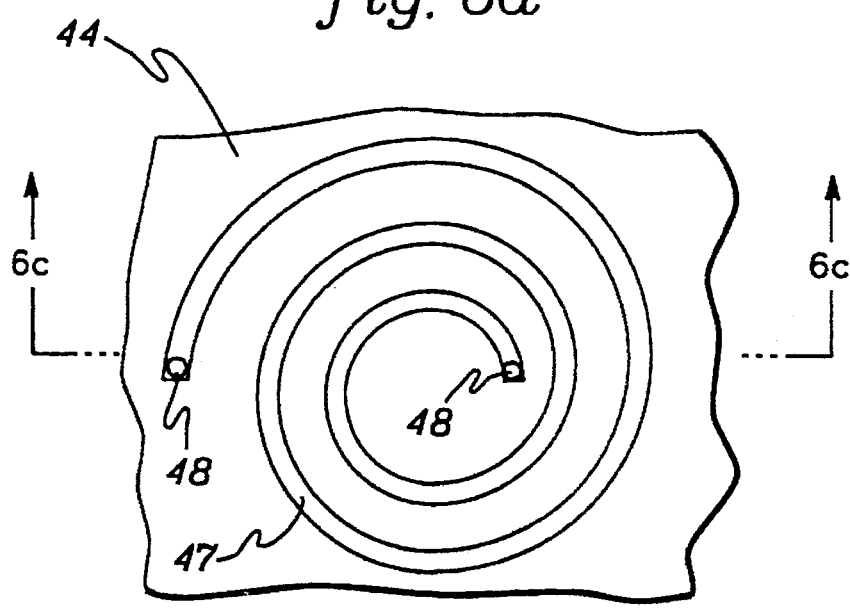
FIG. 6b is a plan view of the structure of FIG. 6a subsequent to formation of an elongated spiral-shaped cavity within material residing above the support structure, the elongated spiral-shaped cavity being useful in formation of a chromatography unit.
Figure 6C:
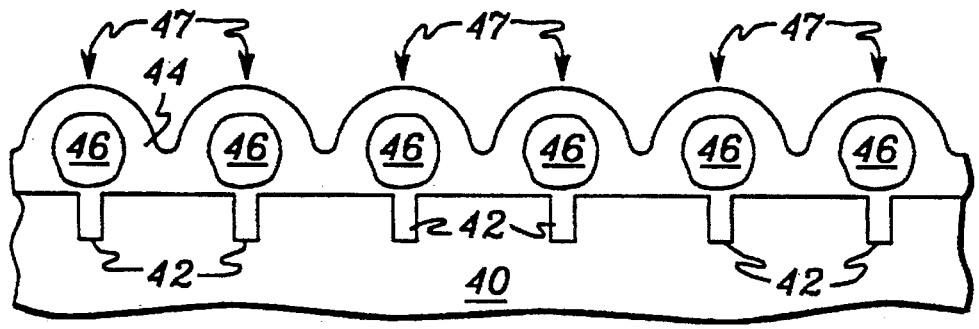
FIG. 6c is a cross-sectional view of FIG. 6b taken along line 6c—6c.

As briefly noted, the cavity structure and formation process presented herein can be employed in a wide variety of applications. FIGS. 6a—6c depict one such application wherein a spiral-shaped cavity is formed for use as a microcavity tube for a chromatography unit. This application requires a long thin tube to separate species of liquid or gas introduced into the tube on the basis of relative sticking coefficients of different species to materials adhered to the inside of the tube. In current practice, the tube is coated with different materials for different selectivities. A detector resides at the tube outlet to detect any species output therefrom.

As shown in FIG. 6a, a spiral-shaped groove 42 is initially formed in a supporting substrate 40. The shape of groove 42 may vary and will depend upon the desired configuration for the resultant tube. An elongated microcavity is then formed employing the process discussed above in connection with FIGS. 1–4. The resultant structure is depicted in FIGS. 6b & 6c. As shown in the cross-sectional view, the inner diameter of elongated tube 46 formed in layer 44 is substantially greater than the width of groove 42 in substrate 40. For this application, inlet and outlet openings 48 (FIG. 6b) are formed at distal ends of the spiral-shaped tube 47. The resultant spiral-shaped tube is then ready for standard personalization processing needed for a selected chromatography application.

Figure 7A:
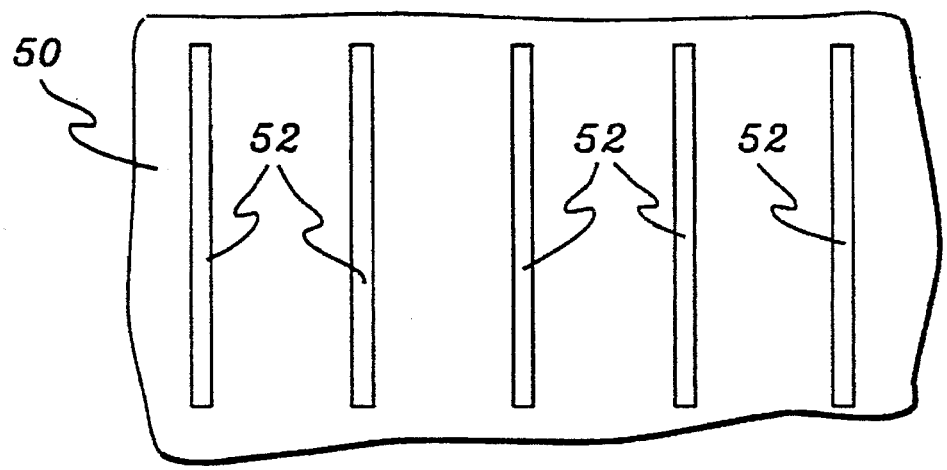
FIG. 7a is a partial plan view of a supporting structure having a plurality of elongated trenches formed therein pursuant to another application of the present invention.
Figure 7B:
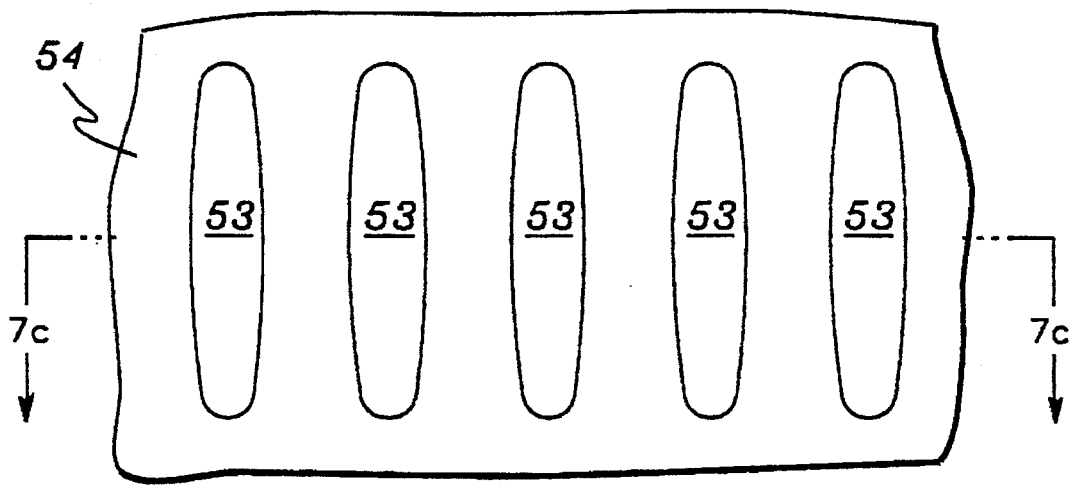
FIG. 7b is a plan view of the structure of FIG. 7a after formation of elongated cavities in dielectric material disposed above the support structure, the elongated cavities to be used in formation of capacitive devices in accordance with the present invention.
Figure 7C:
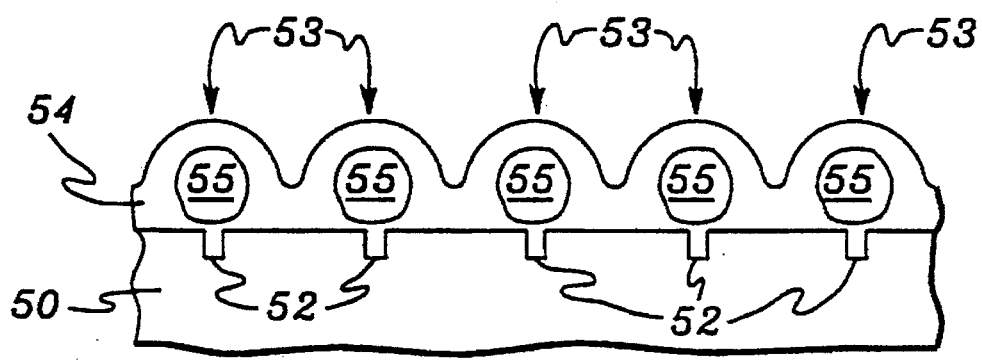
FIG. 7c is a cross-sectional view of FIG. 7b taken along line 7c—7c.
Figure 7D:
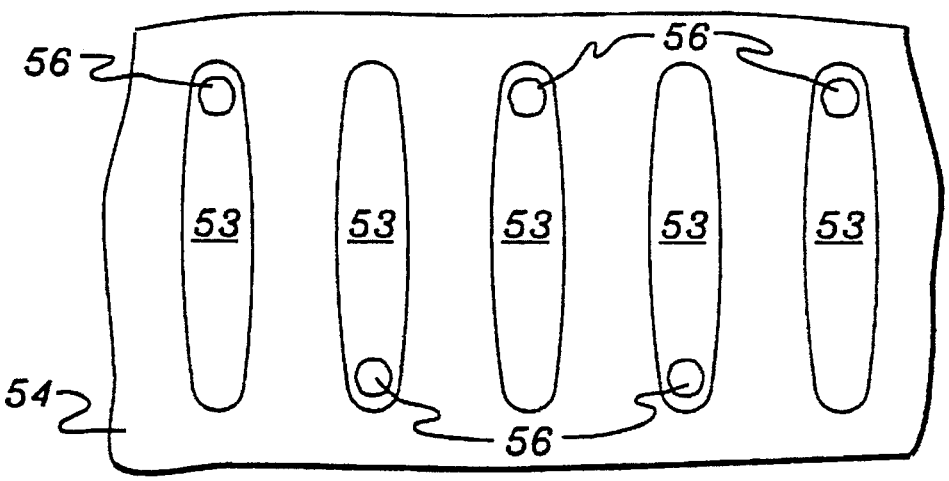
FIG. 7d is a plan view of the structure of FIG. 7b after formation of openings into the elongated cavities in the dielectric material.
Figure 7E:
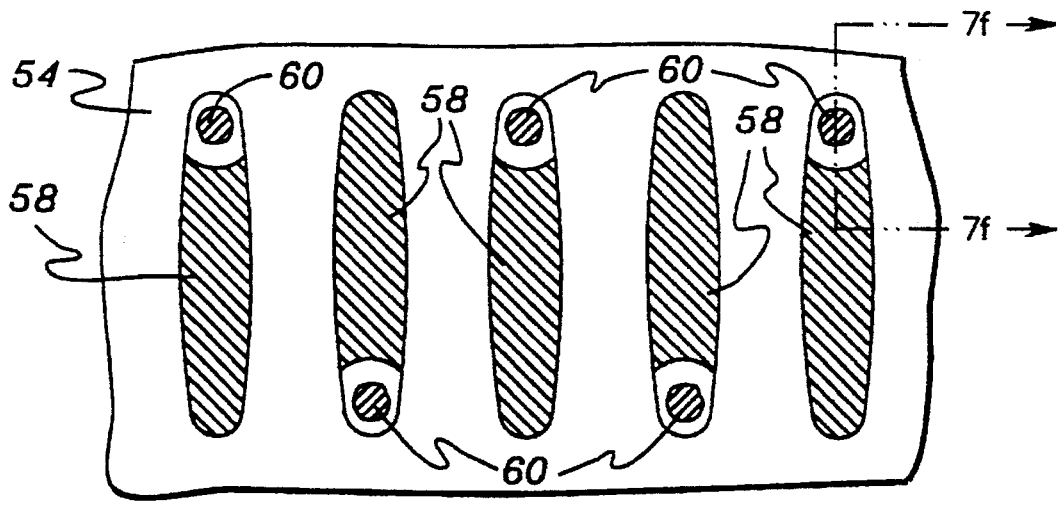
FIG. 7e is a plan view of the structure of FIG. 7d subsequent to formation of metallization above and within the elongated cavities.
Figure 7F:
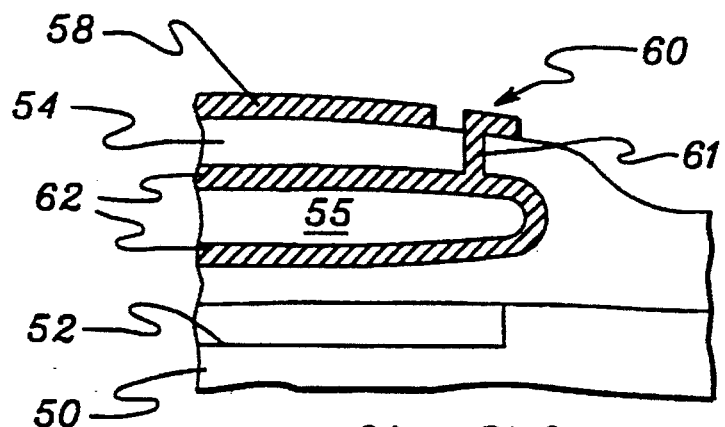
FIG. 7f is a partial cross-sectional view of the structure of FIG. 7e taken along line 7f—7f.
Figure 8A:
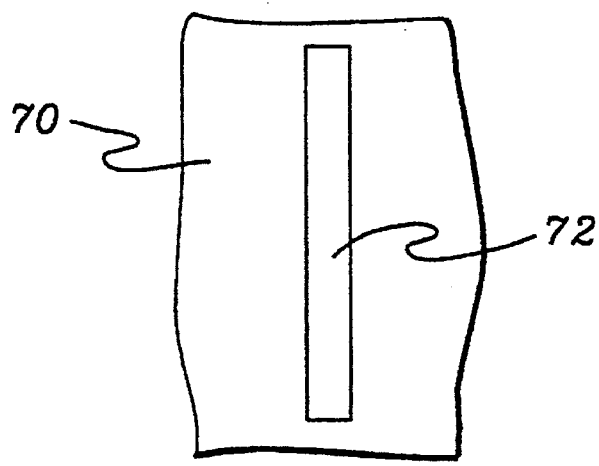
FIG. 8a is a partial plan view of a semiconductor substrate having an elongated trench therein pursuant to still another application of the present invention.
Figure 8B:
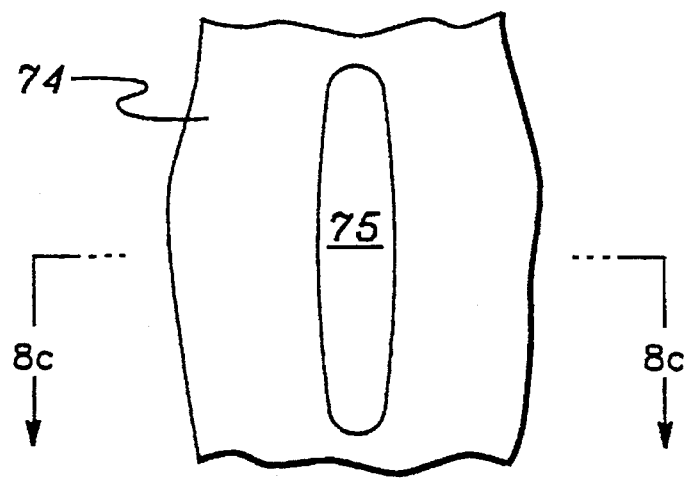
FIG. 8b is a plan view of the semiconductor structure of FIG. 8a subsequent to formation of an elongated cavity in a material disposed above the support structure, the elongated cavity being useful in formation of a pressure sensor in accordance with the present invention.
Figure 8C:
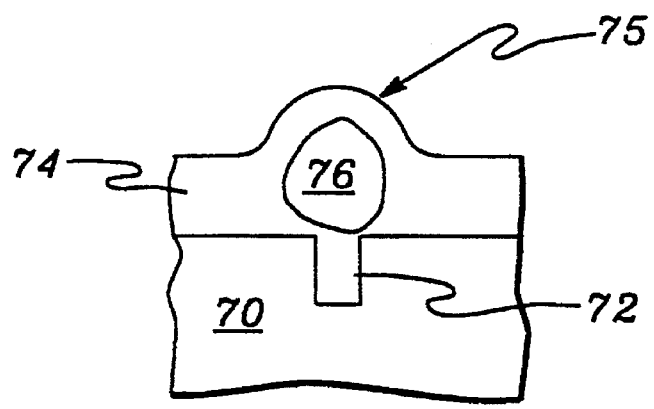
FIG. 8c is a cross-sectional view of the structure of FIG. 8b taken along line 8c—8c.
Figure 8D:
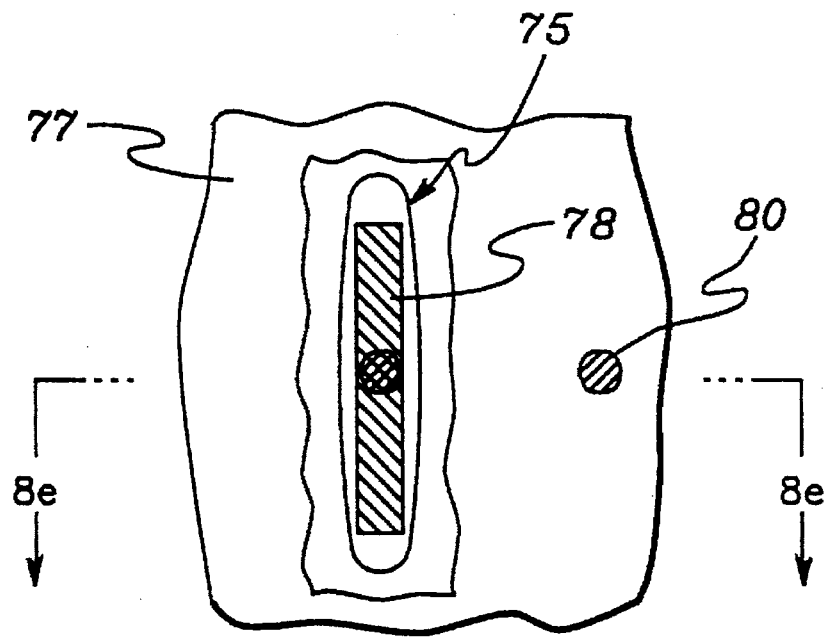
FIG. 8d is a partially cut-away, plan view of the structure of FIG. 8b subsequent to formation of a metal contact to said semiconductor substrate and a metal plate above said elongated cavity.
Figure 8E:
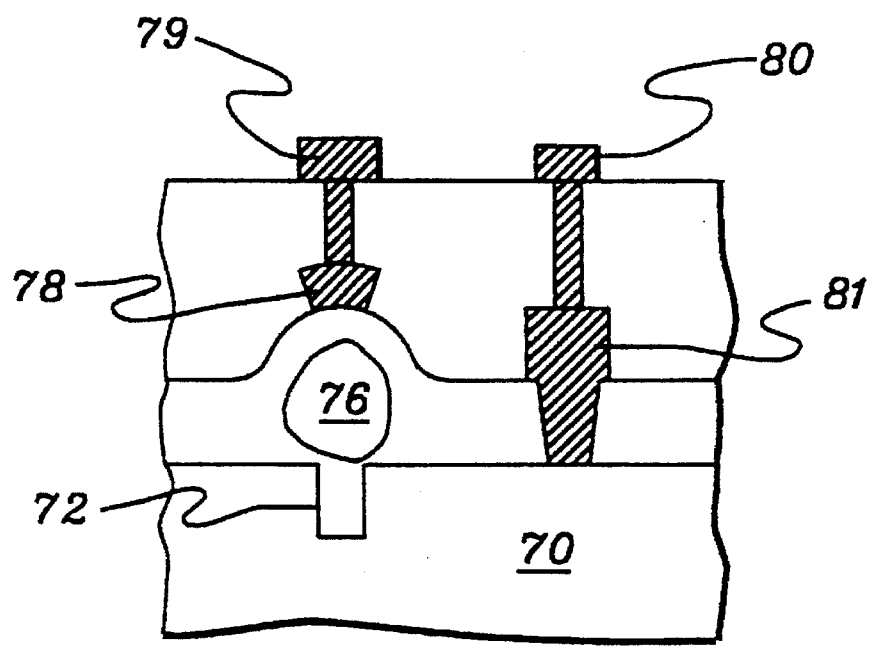
FIG. 8e is a cross-sectional view of the structure of FIG. 8d taken along line 8e—8e.

Another application of the present invention is in the formation of a capacitor or a capacitor array. For this application, processing begins with the formation of a plurality of grooves 52 in a supporting structure 50. (FIG. 7a). Corresponding elongated cavities 55 are then formed in a dielectric layer 54 above substrate 50 in accordance with the processing technique discussed above. Cavities 55 form mounds 53 in the dielectric material roughly aligned with the elongated grooves 52 initially formed in the substrate 50 (FIGS. 7b & 7c). An opening 56 to each cavity 55 in dielectric layer 54 is then provided (FIG. 7d) and a thin-film metallization layer is deposited and patterned such that metal top plates 58 reside above each cavity and such that the inner surface of each cavity 55 has a metal layer 62. Metal studs 61 (FIG. 7f) connect layers 62 within cavities 55 to appropriate contact pads 60, shown adjacent to an end of the cavity (FIG. 7e). As shown, dielectric layer 54 resides between each top plate 58 and the corresponding cavity metallization 62.

FIGS. 8a–8e depict a further application of the present invention, wherein a pressure sensing device is formed. As with the other applications, a groove 72 is initially defined in a substrate 70, (FIG. 8a) within which a pressurized chamber will be established in accordance with the processing technique initially discussed herein. The pressurized chamber (not shown) is allowed to expand in a layer of resilient material 74 (FIGS. 8b & 8c) to produce an enlarged cavity 76 above groove 72 in substrate 70. Using standard metallization techniques, a metal top plate 78 (FIG. 8d) is formed above mound 75 in resilient layer 74. A contact pad 79 (FIG. 8e) connects to top plate contact e a contact pad 80 is coupled to a metal structure 81 which is connected to semiconductor substrate 70 in the vicinity of cavity 76. Semiconductor substrate 70 is assumed to be appropriately doped to facilitate conductance of electrical current. The resultant pressure sensing device employs deflection of microcavity 76 above conductive substrate 70 due to pressure changes, and in particular changes in capacitance between top plate 78 above the microcavity and the conductive substrate 70 below the cavity.

Figure 9A:
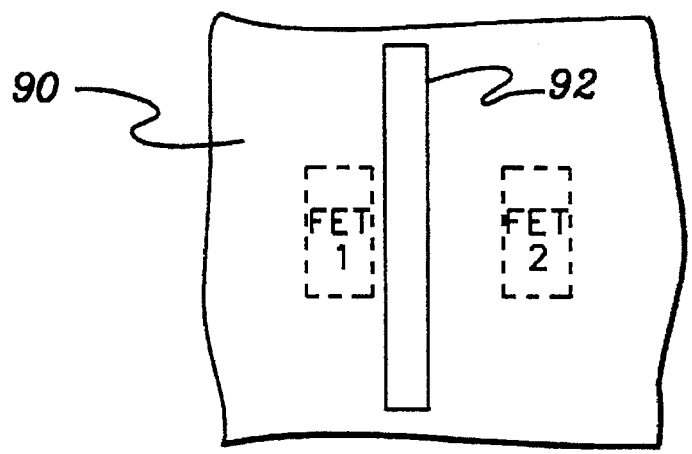
FIG. 9a is a partial plan view of a semiconductor substrate having a noisy FET and a sensitive FET disposed therein and shown separated by an elongated groove in accordance with a further application of the present invention.
Figure 9B:
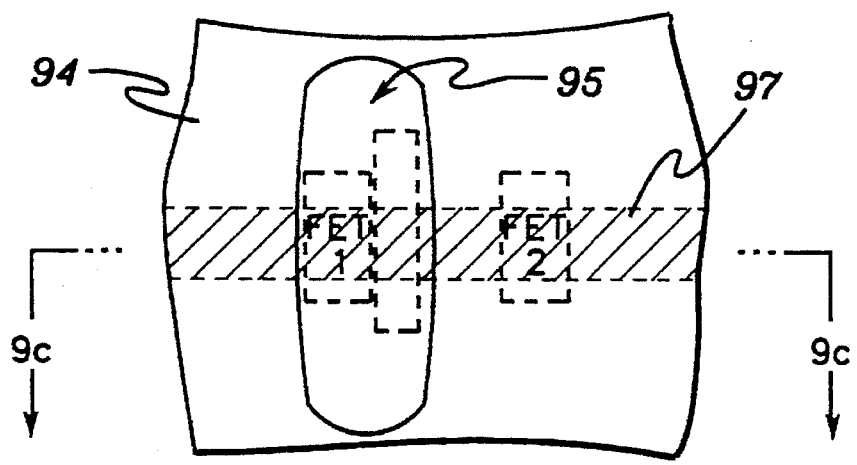
FIG. 9b is a plan view of the structure of FIG. 9a subsequent to formation of an elongated cavity in dielectric material residing above the semiconductor substrate, the elongated cavity being useful in isolating a sensitive FET from a noise emitting FET in accordance with a further application of the present invention.
Figure 9C:
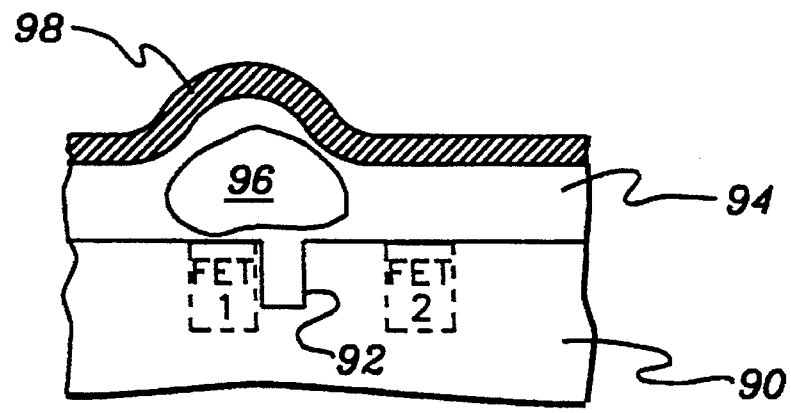
FIG. 9c is a cross-sectional view of the structure of FIG. 9b taken along line 9c—9c.

In the application of FIGS. 9a–9c, a microcavity in accordance with the present invention is employed to separate an overpass conductor from an active, noise emitting device, such as a field-effect transistor (FET). In this application, a groove 92 is initially disposed in a substrate 90 adjacent to the noise emitting device, herein "FET 1". An overpass conductor 98 (FIGS. 9b & 9c) connects to a second active device "FET 2", which is assumed to be noise sensitive such that the overpass conductor needs to be isolated from noise emitting device "FET 1." Cavity formation in accordance with the present invention comprises an easy method for accomplishing this object. In particular, cavity 96 is formed to reside above substrate 90 between noise emitting device "FET 1" and overpass conductor 98 as shown. Again, the size and shape of cavity 96 can be controlled as needed to effectuate the noise isolation function.

Figure 10A:
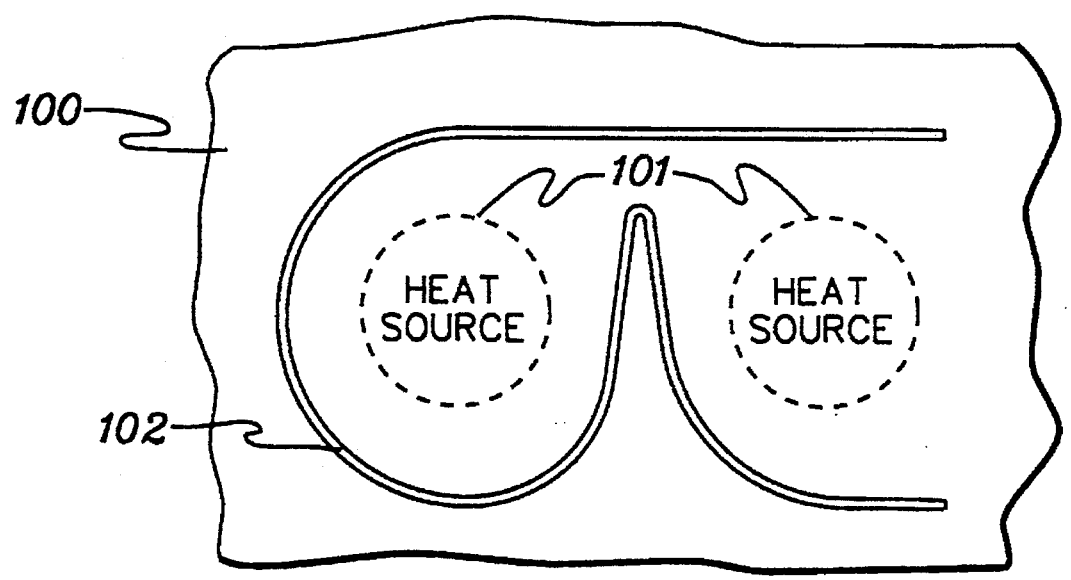
FIG. 10a is a partial plan view of a supporting substrate having multiple heat sources and a groove disposed therein in accordance with a yet further application of the present invention.
Figure 10B:
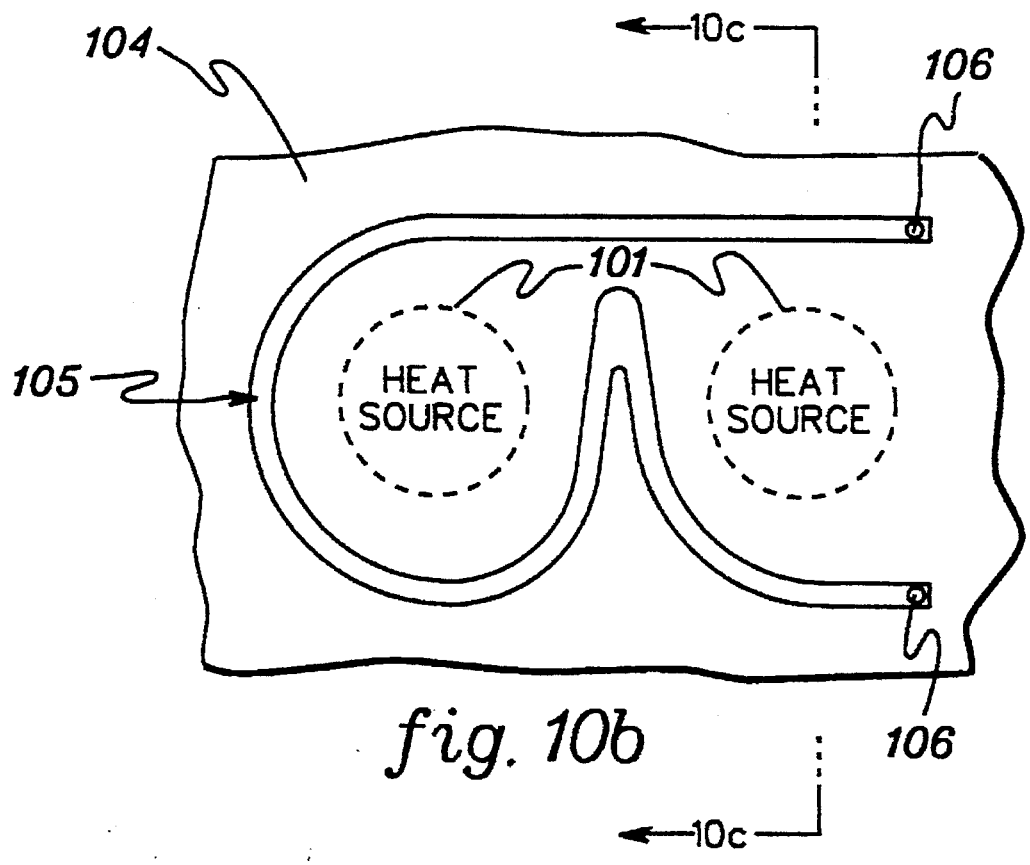
FIG. 10b is a plan view of the structure of FIG. 10a subsequent to formation of an elongated channel in material residing above the supporting substrate, the elongated channel being useful in removing heat generated by the heat sources supported by the supporting substrate.
Figure 10C:
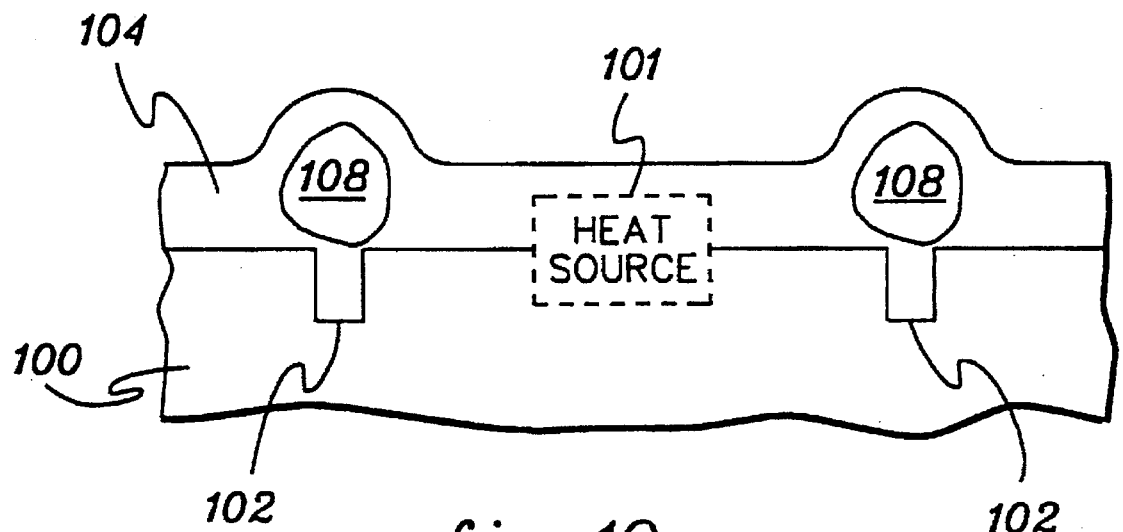
FIG. 10c is a cross-sectional view of the structure of FIG. 10b taken along line 10c—10c.

FIGS. 10a–10c depict application of the present invention in the formation of a heat dissipating, microcavity cooling channel. Fabrication begins with formation of a trench 102 in a supporting substrate 100 (or any layer thereabove) which also supports heat sources 101 (FIG. 10a). An elongated cavity 108 (FIG. 10c) is then formed as presented herein in, for example, a dielectric material 104. Appropriate input/output openings 106 are provided at distal ends of the resultant tubular structure 105 (FIG. 10b). The tube would then be connected to an appropriate gas- or liquid-based heat sink.

Obviously, the size and shape of the heat dissipating tube may vary, with the embodiment of FIGS. 10a–10c being depicted by way of example. One significant feature of a heat dissipating microcavity in accordance with this invention is that the microcavity resides above the supporting substrate in close proximity to the heat generating sources. This is in contrast to most, if not all, prior heat conducting channels which are located in the supporting substrate. Micro-channels can thus be formed around, above or underneath and in close proximity to the heat producing sources. Also, note that use of microcavities in accordance with the present invention for cooling specific heat sources allows discrete cooling at the point of heat generation without requiring implementation of cooling on an entire semiconductor chip.

Figure 11:
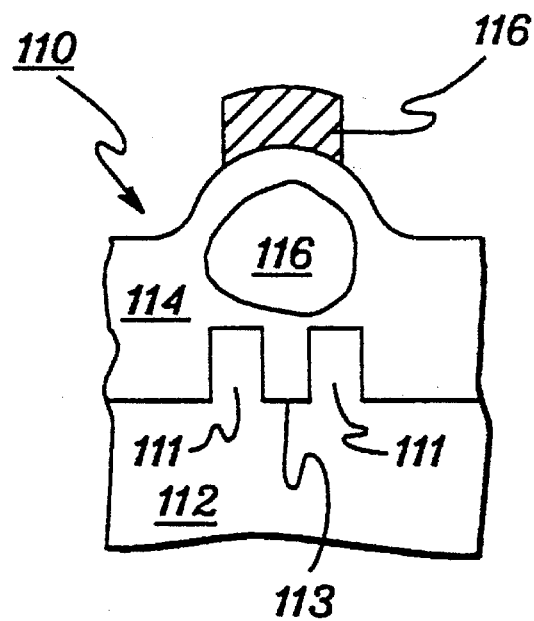
FIG. 11 is a partial cross-sectional view of a cooling channel in accordance with the present invention shown disposed below a heat generating overpass conductor.

FIG. 11 depicts yet another microcavity cooling embodiment wherein a cooling channel 116 is disposed within a dielectric material 114 above mesas 111 of a supporting substrate 112. This structure 110 can be formed essentially as discussed above in connection with FIGS. 5a–5d, i.e., the chamber will initially reside within recess 113 between mesas 111 of support substrate 112. A heat source, such as a power line 118 is disposed over cavity 116, which is assumed to comprise an elongated channel structure as in the embodiment of FIGS. 10a–10c.

FIGS. 12a–12f depict still another embodiment of a microcavity structure and processing method in accordance with the present invention. In this application, an inductor is formed for integrated circuit devices. A cylindrical-shaped microcavity is employed as a template to create an inductor above the semiconductor surface. Conduction pads are created on the substrate surface above and below the microcavity in such a manner as to create a spiral conductive path around the cavity. If desired, the microcavity can be filled with in a separate operation with magnetic material to modify the effect of the inductor.

Figure 12A:
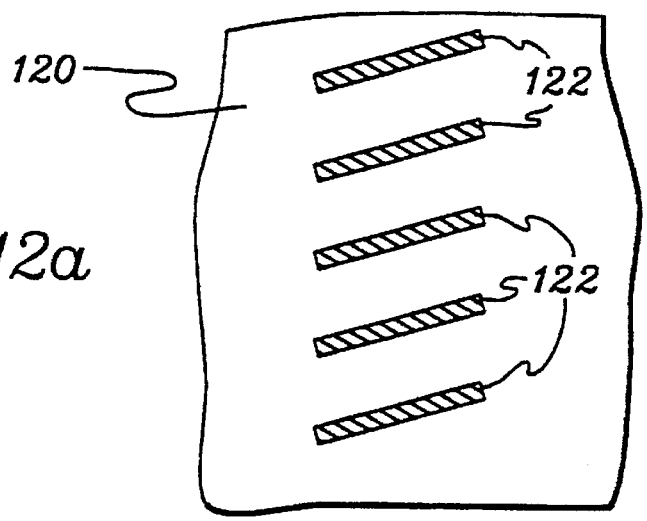
FIG. 12a is a partial plan view of a semiconductor substrate having a lower pattern of conductors disposed thereon.
Figure 12B:
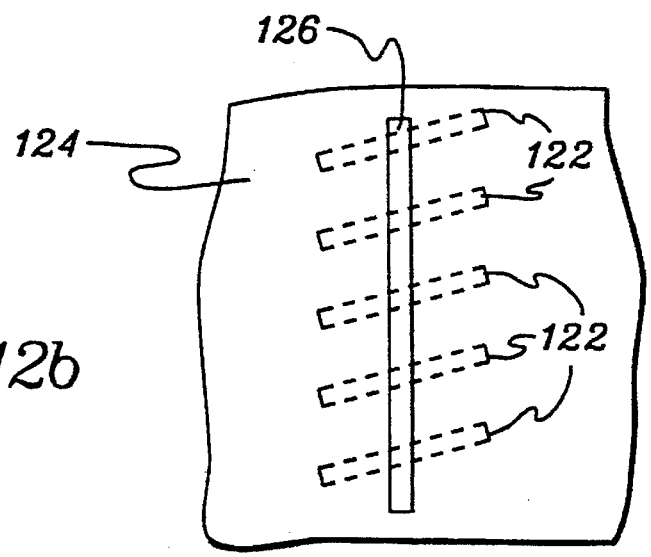
FIG. 12b is a plan view of the structure of FIG. 12a subsequent to formation of a groove in an oxide layer formed above the lower pattern of conductors.
Figure 12C:
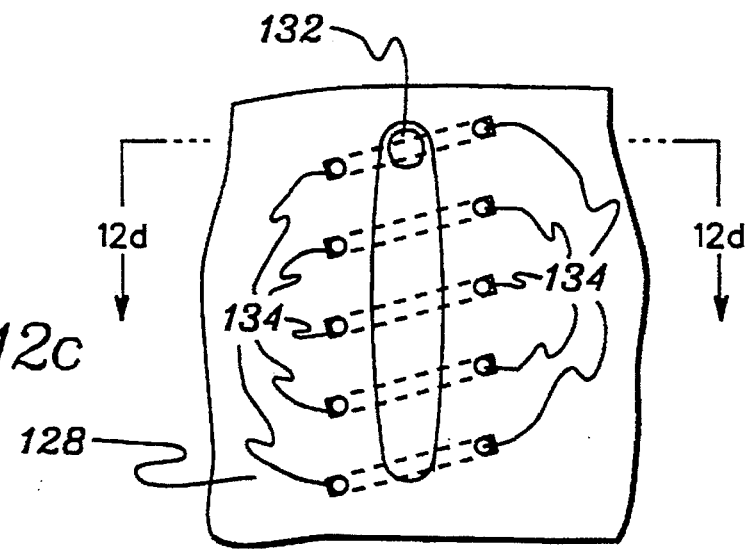
FIG. 12c is a partial plan view of the structure of FIG. 12b subsequent to formation of an elongated cavity in a dielectric layer disposed above the structure of FIG. 12b.
Figure 12D:
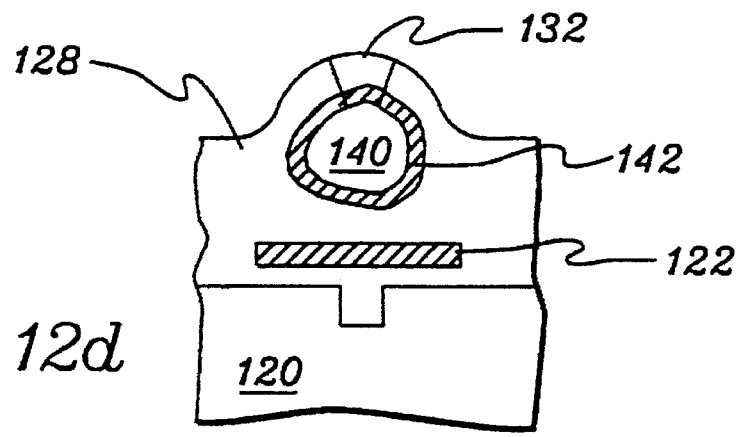
FIG. 12d is a cross-sectional view of the structure of FIG. 12c taken along line 12d—12d.
Figure 12E:
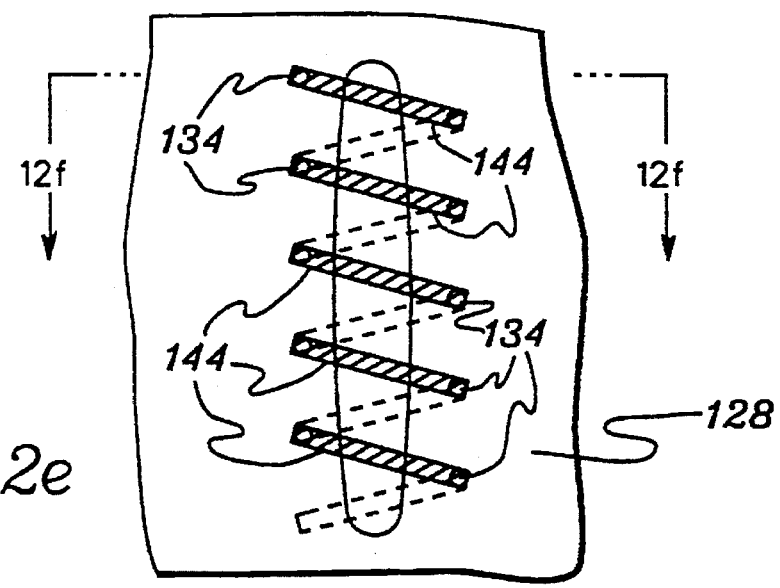
FIG. 12e is a plan view of the structure of FIG. 12c subsequent to formation of an upper pattern of conductors above the elongated cavity such that the upper and lower conductors form a spiral-shaped structure about the elongated cavity.
Figure 12F:
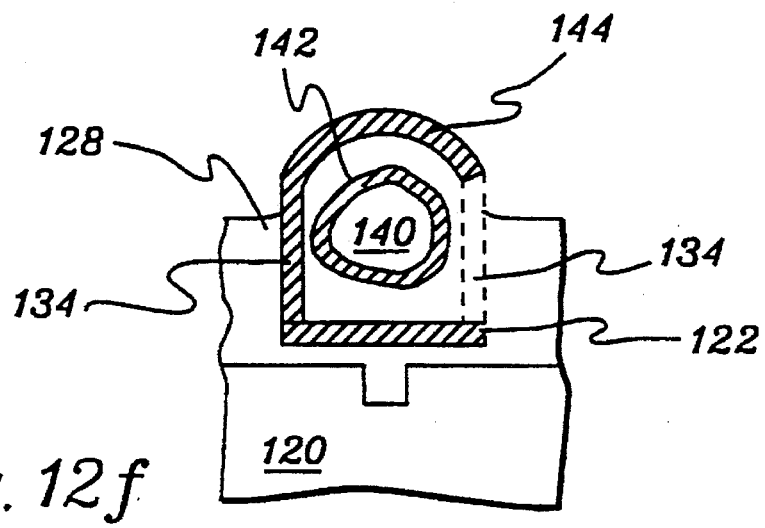
FIG. 12f is a cross-sectional view of the structure of FIG. 12e taken along line 12f—12f.

More particularly, and as shown in FIG. 12a, a lower pattern of conductors 122 is initially formed above a supporting substrate 120. A dielectric, such as an silicon oxide cap is then formed above the pattern of lower conductors, and a trench 126 is created therein so as to intersect the conductors as shown in FIG. 12b. A cylindrical-shaped microcavity 140 is then formed as initially discussed herein. If desired, an opening 132 can be provided therein through which magnetic material can be deposited within the cavity. Metal studs or posts 134 are fabricated about microcavity 140 (see FIGS. 12c & 12d) and an upper conducting layer 144 is deposited, patterned and etched such that upper conductors 144 connect to a respective pair of metal studs 134, which themselves connect to the pattern of lower conductors 122 disposed below microcavity 140 (see FIGS. 12e & 12f).

Those skilled in the art will understand from the above discussion that many other implementations of the various applications are possible, and within the scope of the present invention as defined by the appended claims.

In all aspects, the present invention comprises a novel processing technique, and resultant structure, that includes formation of a pressurized chamber within a resilient material, and following that with a depressurizing of the surrounding environment to allow the chamber to expand and thereby form an enlarged cavity. The size and shape of the enlarged cavity can be readily tailored. For example, any size in the sub-micron to macroscopic range is possible, as well as various configurations such as spherical, elongated and curved. If desired, multiple cavities can be simultaneously and inexpensively mass produced. The gas filled cavities can be easily integrated into various semiconductor and micro-machine applications for mass production. Applications described herein include production of large capacitors, field isolation structures, tubular sensor units (such as micro-chromatography units), pressure sensors, cooling channels and integrated circuit inductors.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A capacitive device comprising:

a support structure having a void therein;

a dielectric material disposed above said support structure and filling said void, said dielectric material having a cavity therein;

a first metal plate disposed above said dielectric material near said cavity in said dielectric material;

a second metal plate disposed within said cavity in said dielectric material; and a first electrical contact to said first metal plate and a second electrical contact to said second metal plate, wherein a capacitor is formed between said first metal plate and said second metal plate.

2. The capacitive structure of claim 1, wherein said first metal plate and said second metal plate each comprise thin-film structures.

3. The capacitive structure of claim 2, wherein said cavity in said dielectric material is disposed above said void in said support structure and is sized larger than said void in said support structure.

4. The capacitive structure of claim 3, wherein said cavity in said dielectric material is sized in a sub-micron to several microns range.

5. The capacitive structure of claim 4, in combination with a plurality of such capacitive structures such that a capacitive array is defined.

* * * * *